United States Patent
Dumas

(10) Patent No.: US 10,261,130 B2
(45) Date of Patent: Apr. 16, 2019

(54) METHOD FOR MEASURING THE AGEING OF PERMANENT MAGNETS OF A SYNCHRONOUS MACHINE FITTED WITH AN ANGULAR POSITION SENSOR

(71) Applicant: LOHR ELECTROMECANIQUE, Hagenbieten (FR)

(72) Inventor: Pierre Dumas, Strasbourg (FR)

(73) Assignee: LOHR ELECTROMECANIQUE, Hangenbieten (FR)

( * ) Notice: Subject to any disclaimer, the term of this patent is extended or adjusted under 35 U.S.C. 154(b) by 0 days.

(21) Appl. No.: 15/119,962

(22) PCT Filed: Feb. 20, 2015

(86) PCT No.: PCT/FR2015/050414
§ 371 (c)(1),
(2) Date: Aug. 22, 2016

(87) PCT Pub. No.: WO2015/124876
PCT Pub. Date: Aug. 27, 2015

(65) Prior Publication Data
US 2017/0067964 A1    Mar. 9, 2017

(30) Foreign Application Priority Data
Feb. 24, 2014  (FR) .................... 14 51452

(51) Int. Cl.
*G01R 31/34* (2006.01)
*G01R 33/04* (2006.01)
(Continued)

(52) U.S. Cl.
CPC .......... *G01R 31/343* (2013.01); *B60L 3/0061* (2013.01); *B60L 9/22* (2013.01);
(Continued)

(58) Field of Classification Search
CPC .. G01R 31/343; G01R 33/04; G01R 33/1215; B60L 15/025; B60L 2200/26;
(Continued)

(56) References Cited

U.S. PATENT DOCUMENTS 6,097,129 A    8/2000  Furtwaengler et al.
8,610,452 B2 *  12/2013  Lee ..................... G01R 31/343
                                                    318/490
(Continued)

FOREIGN PATENT DOCUMENTS

DE           3405225        8/1984
DE       102008059005      5/2010
(Continued)

OTHER PUBLICATIONS

International Search Report conducted in related application PCT/FR2015/050443, dated Apr. 14, 2016.
(Continued)

*Primary Examiner* — Jay Patidar
(74) *Attorney, Agent, or Firm* — Meunier Carlin & Curfman LLC

(57) ABSTRACT

The invention relates to a method for measuring ageing of permanent magnets of a synchronous machine comprising a stator and a rotor, the machine being fitted with at least one angular position sensor of the rotor, the rotor comprising permanent magnets provided to move said rotor around the stator, the angular position sensor comprising at least two fixed magnetic induction measurement sensors extending to an axial end of the rotor, facing and immediately adjacent to the axial edges of the permanent magnets, characterized in that the method consists of: j1) determining, while stopped or during a laden or unladen rotation phase of the synchronous machine, the maximum value of the magnetic induction using the magnetic induction measurement sensors and
(Continued)

the electronic unit; j2) comparing the measured maximum magnetic induction value with a reference value; and j3) if the maximum magnetic induction value is less than the reference value, presenting a difference determined with respect to said reference value in order to generate warning information S using the electronics unit and, if this is not the case, returning to step j1).

10 Claims, 3 Drawing Sheets

(51) Int. Cl.

| | |
|---|---|
| *H02P 23/14* | (2006.01) |
| *B60L 3/00* | (2019.01) |
| *B60L 9/22* | (2006.01) |
| *B60L 9/28* | (2006.01) |
| *B60L 15/02* | (2006.01) |
| *H02P 6/16* | (2016.01) |
| *H02K 11/20* | (2016.01) |
| *H02K 11/21* | (2016.01) |
| *G01R 33/12* | (2006.01) |

(52) U.S. Cl.
CPC .............. *B60L 9/28* (2013.01); *B60L 15/025* (2013.01); *G01R 33/04* (2013.01); *G01R 33/1215* (2013.01); *H02K 11/20* (2016.01); *H02K 11/21* (2016.01); *H02P 6/16* (2013.01); *H02P 23/14* (2013.01); *B60L 2200/26* (2013.01); *B60L 2210/20* (2013.01); *B60L 2210/40* (2013.01); *B60L 2220/14* (2013.01); *B60L 2240/421* (2013.01); *B60L 2240/80* (2013.01); *B60L 2250/10* (2013.01); *H02P 2207/05* (2013.01); *Y02T 10/643* (2013.01); *Y02T 10/725* (2013.01); *Y02T 10/7241* (2013.01)

(58) Field of Classification Search
CPC ............. B60L 2210/20; B60L 2210/40; B60L 2220/14; B60L 2240/421; B60L 2240/80; B60L 2250/10; B60L 3/0061; B60L 9/22; B60L 9/28
USPC .......................................................... 324/205
See application file for complete search history.

(56) References Cited

U.S. PATENT DOCUMENTS

| | | | |
|---|---|---|---|
| 9,647,591 B2 * | 5/2017 | West | ..................... H02P 21/141 |
| 2002/0175674 A1 | 11/2002 | Raftari | |
| 2012/0068653 A1 | 3/2012 | Horiuchi et al. | |
| 2012/0306422 A1 * | 12/2012 | Hao | .......................... G01K 7/22 318/490 |
| 2013/0033215 A1 | 2/2013 | Krishnamurthy et al. | |
| 2015/0285767 A1 * | 10/2015 | Ouellette | ............... G01R 33/04 324/240 |
| 2017/0023347 A1 * | 1/2017 | Ouellette | ............... D07B 1/145 |

FOREIGN PATENT DOCUMENTS

| | | |
|---|---|---|
| DE | 102011056252 | 6/2013 |
| EP | 0552991 | 7/1993 |
| EP | 1758230 | 2/2007 |
| FR | 2680920 | 3/1993 |
| FR | 2987439 | 8/2013 |
| GB | 2483177 | 2/2012 |

OTHER PUBLICATIONS

International Search Report conducted in related application PCT/FR2015/050414, dated Apr. 7, 2016.
International Search Report conducted in related application PCT/FR2015/050367, dated May 8, 2015.

* cited by examiner

METHOD FOR MEASURING THE AGEING OF PERMANENT MAGNETS OF A SYNCHRONOUS MACHINE FITTED WITH AN ANGULAR POSITION SENSOR

CROSS REFERENCE TO RELATED APPLICATION

This application is a national stage application of International PCT Application No. PCT/FR2015/050414, filed Feb. 20, 2015, which claims priority to, and the benefit of, French Application No. 1451452, filed Feb. 24, 2014, each of which is incorporated by reference herein in its entirety.

TECHNICAL DOMAIN

This invention refers to the general technical domain of angular position sensors and the general technical domain of synchronous machines comprising permanent magnets and a position sensor of that type.

More particularly, this invention concerns a synchronous machine using sinusoidal, trapezoidal or other electromotive force, comprising a position sensor to control the electric power supply of the said machine. Essentially, the invention is applicable in the field of synchronous machines powered by a multiphase AC voltage.

The invention will be described in greater detail in the following but in a non-limiting manner, with means of generating magnetic induction using permanent magnets.

A synchronous machine using permanent magnets comprises a wound stator and a rotor supporting permanent magnets. A machine of this type is supplied and driven by means of power electronics.

A synchronous machine using permanent magnets and sinusoidal electromotive force can be controlled by a vectorial control system. This type of control, known as such, allows high performance to be obtained, that is, high precision and high dynamic torque. This performance is necessary, in particular for traction motors.

A control system allowing high performance to be obtained, however, requires accurate knowledge of the angular position of the rotor in real time. Generally, the angular position of the rotor is given by the position sensor comprising in particular a rotating part mechanically linked with the rotor. There are different known technologies for determining the angular position of the rotor. For instance, we might refer to the position sensor known as the "resolver", the incremental digital encoder or the absolute encoder.

These known technologies however embody drawbacks. Indeed, the known position sensors all have a rotating part which is mechanically linked with the rotor. This is a major constraint affecting the design of the machine into which the position sensors are to be integrated. As a general rule, the rotating part of the angular position sensor is driven in rotation via a driving tube. As a general rule, such a driving tube passes through the stator and very often has high inertia which can make the measurement of the angular position slower. The lack of precision offered by a measurement of this type results in the alteration of the machine performance. In addition, the fact that it is necessary to pass through the machine to recover angular position information substantially increases the overall complexity. This means using a greater number of mechanical parts, increasing the risks of failure.

Furthermore, on the initial commissioning of a known synchronous machine, an operation known as calibration must be carried out by a converter. During this operation, the machine is rotating and the converter measures the angle corresponding to the electromotive force passing through zero. This calibration operation must be performed again for maintenance operations such as a change of sensor, a change of a rotor or stator or of an electromagnetic part or a change of the complete machine. A calibration operation like this is often difficult to perform, especially for long vehicles such as a railway vehicle since the said vehicles must be lifted to allow the free orientation of the wheels during calibration.

The calibration operation is however particularly important because an angular offset between the measured angular position of the rotor and its real position results in a large drop in torque. For instance, an offset of one mechanical degree causes a drop of approximately 5% and an offset of two mechanical degrees produces a torque drop of 20%.

The known synchronous machines also produce lower performance due to the ageing of permanent magnets. Indeed, the magnetic induction generated by permanent magnets decreases with time. It is therefore logical to replace the permanent magnets periodically. Replacing the permanent magnets can result in high costs in terms of spares, manpower and/or the immobilization of the machine. Often, such replacement takes place too early, generating pointless expenses, or too late, leading to a synchronous machine offering degraded performance being used.

From the document US 2002/175674, there is a known method and device aimed at detecting the degradation of a permanent magnet in the motor of an electric hybrid or all-electric vehicle. A voltage monitoring device is connected directly to a traction motor and/or to the generator motor to detect the voltage induced by the permanent magnets in the motor at a predetermined speed and when incapable of being on load. A controller compares the detected induced voltage with a reference voltage, representing an expected induced voltage for full magnetization at the predetermined speed. The control device generates an indication of the magnetization depending on the reference voltage, the detected induced voltage and the predetermined speed. The indication of the magnetization is recorded as a subsequent reference. In addition, a safety indicator generates a signal to warn the vehicle user when the magnetization indication drops below a safety threshold.

The device described in the document US 2002/175674 concerns a centrally-mounted permanent magnet rotor, enclosed by a wound stator. In this document, the magnetization is measured by means of a winding which is wound around the teeth of the rotor and incorporated into them.

The device described in document US 2002/175674 is not capable of detecting the degradation of a permanent magnet in an electric motor under load, that is when the machine is under load or supplies torque, but only in a free rotation electric motor. This is a major drawback. Indeed, in the document US 2002/175674 the magnetization field of the rotor magnets is measured by measuring the current induced in the winding which is wound on the rotor teeth. Since this magnetization field depends on the intensity of the electric current circulating through the winding, and that current depends on the electric motor load, the winding magnetization field therefore varies according to the solicitation of the electric motor. When the electric motor is onload, the magnetization field of the winding varies constantly according to solicitations on the electric motor and the induced detected voltage cannot therefore be compared to a reference voltage which represents an induced voltage expected for full magnetization. Similarly, the measured winding wound on the rotor teeth cannot discriminate between the stator winding magnetization field and the magnetization field generated by the rotor magnets, hence the need in the device of document US 2002/175674 to make the measurement when the stator winding magnetization field is zero, equivalent to saying that the electric motor has to be driven while free-wheeling.

DISCLOSURE OF THE INVENTION

Accordingly, the purpose of this invention is to overcome the drawbacks mentioned above and propose a new method for determining the ageing level of a synchronous machine.

Another purpose of this invention is the implementing of such a method for determining an ageing level using a few simple, reliable and low cost means.

The purposes assigned to the invention are achieved by a method of measuring the ageing of the permanent magnets in a multiphase synchronous machine comprising a stator and a rotor, the said machine being equipped with at least one rotor angular position sensor, the stator comprising a winding designed to be supplied with current, the rotor comprising permanent magnets designed to move about the stator, the angular position sensor comprising at least two magnetic induction measuring sensors and at least one electronic unit, the fixed induction measuring sensors integral with the stator, extending at the axial end of the rotor opposite to and immediately next to the axial edges of the permanent magnets, characterized in that it consists in:

j1) determining, at a stop or during an on load or off load rotation phase of the synchronous machine, the maximum magnetic induction value through magnetic induction measurement sensors connected to the electronic unit, j2) comparing the measured maximum magnetic induction value with a reference value, and j3) if the maximum magnetic induction value is less than the reference value, and having a determined deviation with respect to the said reference value, generating alert information by means of the electronic unit, or otherwise reverting back to step j1).

According to one implementation example complying with the invention, the method consists in using a maximum magnetic induction value measured during the initial use of the synchronous machine as a reference value.

According to one implementation example complying with the invention, the method consists in using a theoretical or predefined value as a reference value.

According to one implementation example complying with the invention, the method consists in using a value decreasing with time as a reference value.

According to one implementation example complying with the invention, the method consists in using a value having a linear decrease as a reference value.

According to one implementation example complying with the invention, the method consists in generating the alert information when the deviation is equal to or greater than 20%.

According to an implementation example conforming to the invention, the method is applied to a vehicle wheel motor.

According to an implementation example conforming to the invention, the method is used on a measuring bench during wheel motor maintenance operations.

According to an implementation example of the method conforming to the invention, when the synchronous machine is on load, the measured value $VM_{max}$ of the maximum magnetic induction is compared to a predetermined reference value, stored in a set of data comprising maximum magnetic induction values for given an electric current intensity supplied to the synchronous machine.

According to an implementation example of the method conforming to the invention, the set of data comprising the maximum magnetic induction values for given electric current intensity supplied to the synchronous machine is stored in the electronic unit.

The synchronous machine in which the method conforming to the invention is implemented advantageously comprises the wheel motor of a railway or road-going vehicle.

The measurement process conforming to the invention also offers the advantage of supplying accurate measurements, in real time and at chosen time intervals, of the ageing of the permanent magnets in the synchronous machine.

The method conforming to the invention has an outstanding advantage resulting from the use of a rotor angular position sensor to establish the development of the magnetic field in time and therefore estimate whether the synchronous machine is sound or whether it has undergone ageing that could be damaging to its performance.

It will also be noted that the method conforming to the invention advantageously allows the magnetic fields to be measured when the synchronous machine is of a rotating type, whether it is operating without a load or under load.

Operation off load refers to the fact that the synchronous machine is free-wheeling whereas operation under load means that the synchronous machine is rotating and supplying torque, whether it concerns braking or acceleration.

It will also be noted that the method conforming to the invention advantageously allows the magnetic fields to be measured when the synchronous machine is at a stop wherein the magnetic field measurement is made for the magnets located on the face of the sensors. To carry out complete mapping of the machine magnets, it simply requires its rotation to bring each of the magnets opposite the sensors, one by one.

Finally, in the invention, magnetization is measured by means of Hall effect or magnetoresistance sensors mounted to a removable support making maintenance accordingly particularly easy.

BRIEF DESCRIPTION OF FIGURES

Other characteristics and advantages of the invention will also appear in the drawings provided as non-limiting illustrations and in which.

DETAILED DESCRIPTION OF FIGURES

Figure 1:
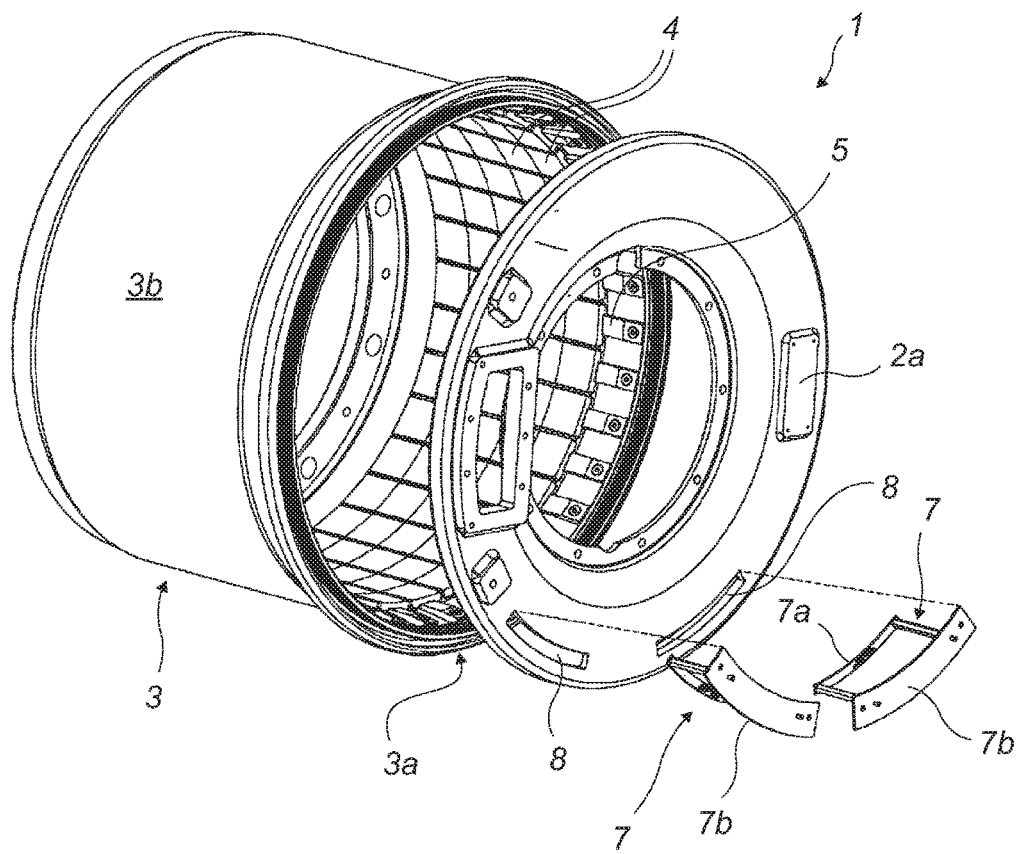
FIG. 1 illustrates an example of the embodiment of a synchronous machine implementing a method conforming to the invention, the said machine incorporating an angular position sensor on part of a stator.
Figure 4:
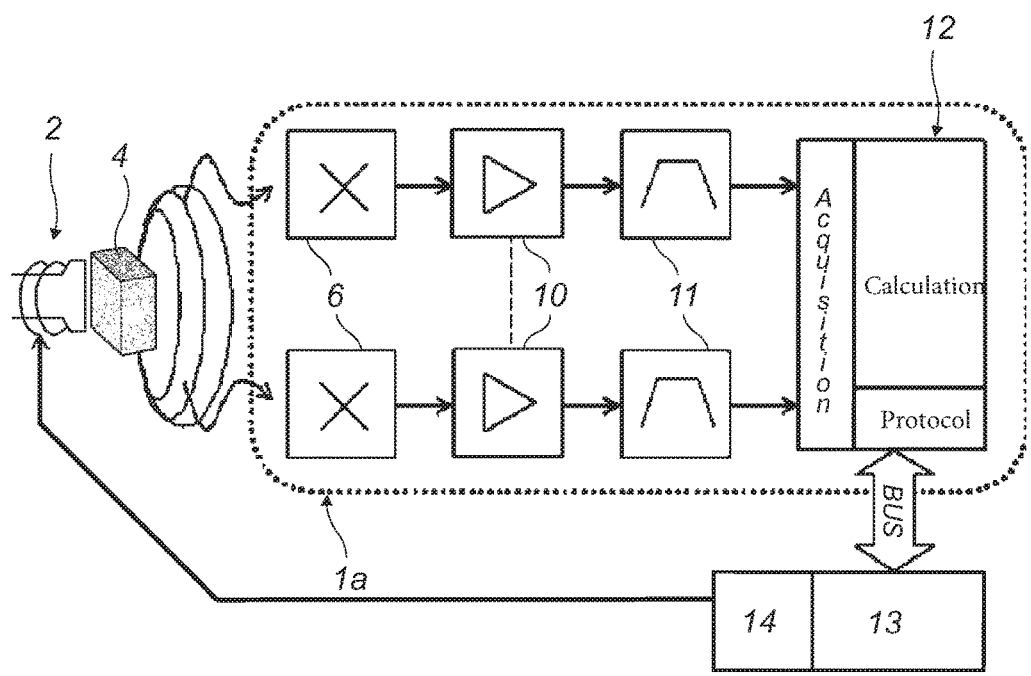
FIG. 4 illustrates a block diagram of the electronic means required to operate the angular position sensor of asynchronous machine and, accordingly, used to implement the method conforming to the invention.

FIG. 1 illustrates an example of the embodiment of a synchronous machine 1 comprising an angular position sensor mounted to a stator 2 illustrated schematically in FIG. 4. FIG. 1 shows part of the end 2a, for instance, in the form of a flange mechanically integral with the stator 2.

The synchronous machine 1 also includes a rotor 3 provided with permanent magnets 4.

The part of end 2a covers at least partially, and without contacts, and axial end 3a of the rotor 3. An example of the setup between the axial end 3a and the end part 2a is illustrated in greater detail in FIG. 2.

The stator 2 comprises a winding, not shown, designed to be supplied with multiphase current by an electronic power device also known as a converter or inverter. Advantageously, the latter is supplied with voltage and current.

The rotor 3 advantageously has a substantially cylindrical shape 3b, the inner face of which is covered with permanent magnets 4. The rotor 3 is designed to rotate about the part of the stator 2 extending in the free space contained inside the said rotor 3.

The permanent magnets 4 are, for instance, stacked in an axial direction of the axial grooves made in the inside face of cylinder 3b. The assembly and attachment of the permanent magnets 4 to the inside face of the rotor 3 is done in a known manner.

For instance, the permanent magnets 4 are inserted by being slid into the axial grooves where they are held radially by the matching shapes of the said grooves and the said permanent magnets 4.

Figure 2:
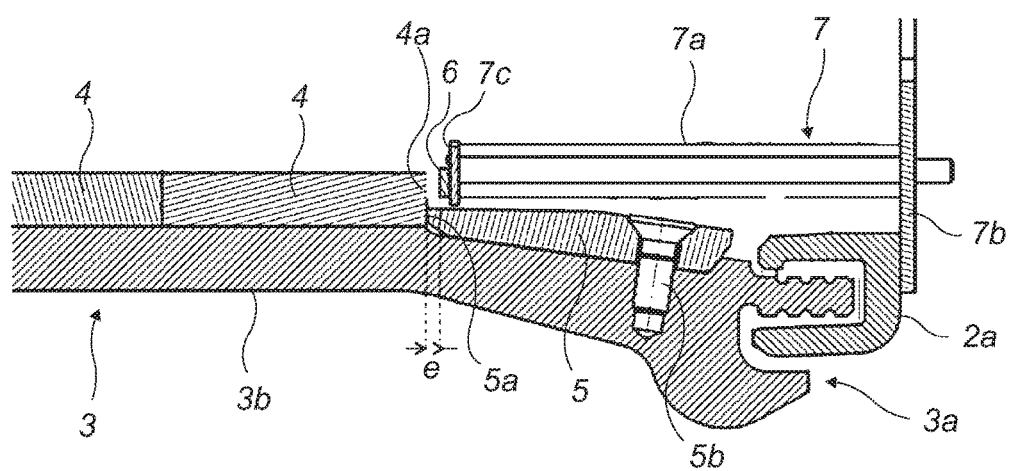
FIG. 2 shows a sectional detail view of FIG. 1.

Axially, the permanent magnets 4 are locked in each groove by means of a retaining part 5 of an anti-magnetic material, illustrated in greater detail in the FIG. 2.

The retaining part 5 forms a stop 5a preventing the axial movement of the permanent magnets 4 engaged in the corresponding groove. The sizes and shapes of the retaining part 5 are chosen so as not to impede access to an area located opposite at least one part of axial edge 4a of the last permanent magnet 4 engaged in each groove.

The axial end 3a of the cylinder 3b, which does not have permanent magnets 4, advantageously comprises for the purpose a slightly hollowed out shape in a radial direction. This shape makes it possible to limit the dimensions resulting from the attachment of the retaining part 5. Advantageously, a retaining part 5 is attached to the cylinder 3b, at the end of each groove by a screw 5b, thus actively locking all the rows of permanent magnets 4.

The synchronous machine 1 also comprises an angular position sensor for rotor 3. In particular, the angular position sensor has magnetic induction measuring sensors 6. The latter are designed to detect the variation of the axial magnetic field generated by the permanent magnets 4. This variation of the axial magnetic field is detected and converted into voltage, supplied by the measurement sensors of the magnetic induction 6.

Angular position sensor 1a also comprises at least one electronic unit designed to receive the induction voltages from the magnetic induction measurement sensors 6 and to deduct from them the angular position of rotor 3. This determination is carried out in an absolute manner. The electronic unit also allows real-time transmission of information relative to the angular position of rotor 3 to the electronic power device.

The magnetic induction measurement sensors 6 are mechanically integral with the end part 2a and extend at an axial end of rotor 3, opposite and immediately next to the axial edges 4a of the last permanent magnets 4 engaged in the grooves. When rotor 3 rotates, each axial edge 4a therefore passes in front of magnetic induction measurement sensors 6.

Advantageously, magnetic measurement sensors 6 are attached to a removable support 7.

For this purpose, the removable support 7 has an axial support part 7a and a support end part 7b. The end part of the support 7b extends substantially transversely to the part of the axial support 7a. The magnetic induction measurement sensors 6 are arranged on an outer face 7c of the free end of the axial support part 7a.

The removable support 7 preferably forms a curve substantially matching the curve of the rotor 3. The magnetic induction measurement sensors 6 are advantageously attached and set out on the outer face 7c, on a line the curve of which substantially matches the curve of the succession of axial edges 4a of the permanent magnets 4.

The removable support 7 is, for instance, inserted into a slot 8 made in the end part 2a. Naturally, the slot 8 has a curve which is identical or similar to that in the part of the axial support 7a.

Once the removable support 7 is provided with the magnetic induction measurement sensors 6, it is axially inserted into the slot 8 until it abuts on the end part of support 7b, on the outer face of end part 2a. The dimensions of the removable support 7, and in particular the axial length of the axial support part 7a are chosen so that the magnetic induction measurement sensors 6 extend to a distance e from the axial edges 4a. The distance e is included for instance between 1.5 and 2.5 millimeters and preferably equal to 2 millimeters.

All types of attaching means, not shown, can also be used to make the end of support 7b integral with the end part 2a.

In one example of the embodiment, the synchronous machine 1 comprises at least three magnetic induction measurement sensors 6 arranged on a removable support 7.

In another example of the embodiment, the synchronous machine 1 complying to the invention, illustrated in FIG. 1, comprises two removable supports 7 each of which is provided with, for instance, at least two magnetic induction measurement sensors 6.

Figure 3:
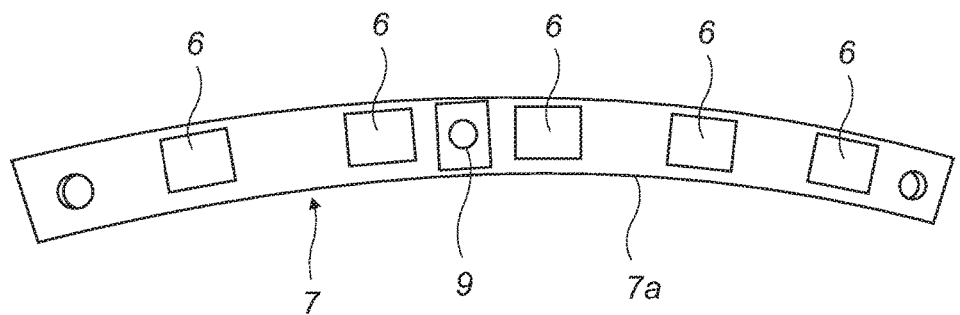
FIG. 3 is an example of the embodiment of a removable support for the angular position sensor, shown at an angle in a head-on position, designed for insertion into a synchronous machine in which the method conforming to the invention is implemented.

FIG. 3 is a head-on illustration of an example of the embodiment of a removable support 7 comprising five magnetic induction measurement sensors 6. Accordingly, according to an example of the embodiment in FIG. 3, the synchronous machine 1 comprises two removable supports 7 each comprising five magnetic induction measurement sensors 6.

Advantageously, the outer face 7c of the axial support part 7a is provided with a temperature sensor 9. The latter is used for measuring the ambient temperature of the synchronous machine 1 in order to adjust its control because the induction depends on the temperature.

In a preferential example of the embodiment, the removable support 7 comprises at least one electronic circuit of the electronic unit or one part of the electronic circuit of the said electronic unit.

As an example, the electronic power device is a converter 14 controlling the synchronous machine 1 by pulse width modulation.

The magnetic induction measurement sensors 6 are preferably Hall effect sensors.

In another example of the embodiment of synchronous machine 1, the magnetic induction measurement sensors 6 consist of AMR/GMR sensors known as magnetoresistance sensors.

While the Hall effect sensors can be used for measuring the continuous component of the magnetic field, magnetoresistance sensors operate on the basis of the electrical resistance variation of a material depending on the direction of the magnetic field applied to it. These sensors are known as such and accordingly are not described any further.

By using Hall effect sensors or magnetoresistance sensors, the operation of calibrating the angular position sensor 1a is no longer necessary. Indeed, these sensors measure the spatial distribution of the magnetic field generated by the permanent magnets 4 even when the synchronous machine 1 is at a stop. This dispenses with the need for any calibration operation on the commissioning of the synchronous machine 1 or after a maintenance operation on the said synchronous machine 1. This represents an outstanding advantage for the synchronous machine 1.

FIG. 4 is a block diagram of the electronic means required for the operation of the angular position sensor 1a of synchronous machine 1. The latter therefore comprises the wound stator 2 and the rotor 3 comprising the permanent magnets 4.

The angular position sensor 1a therefore includes functional means which comprise induction measurement sensors 6, associated with the electronic unit for the acquisition of a signal and for calculating the positioning angle of the rotor 3.

The functional means comprise, for instance, two magnetic induction measuring sensors 6, mounted in a fixed manner, without contact, and facing the permanent magnets 4. Information coming from these induction measuring sensors 6 is then amplified and filtered respectively by amplification means 10 and filtering means 11, before being acquired by a computer 12. This computer 12 of the electronic unit therefore determines a rotor angle (angular position of the rotor) from the information from the induction measuring sensors 6 and in real time transmits the rotor angle to a vectorial control system 13 which controls a converter 14.

The communication of the rotor angle to the vectorial control system 13 is via a field BUS type protocol of the SSI, PROFIBUS or other type. In addition, the sign of the rotor angle determined by the computer 12 defines the direction of rotation of the synchronous machine 1.

Figure 5:
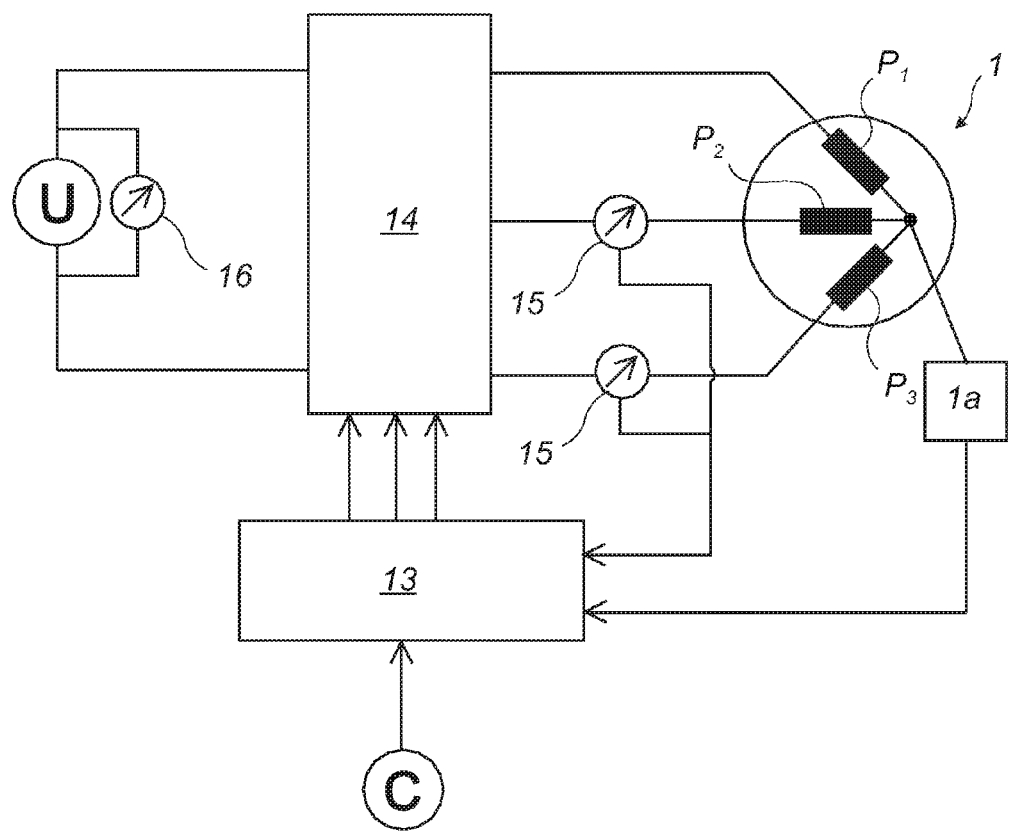
FIG. 5 illustrates, by means of a functional diagram, an example of the vectorial control system of a permanent magnet and sinusoidal electromotive force synchronous machine, in which the method conforming to the invention is implemented.

FIG. 5, by means of a functional diagram, illustrates the vectorial control system 13 of a synchronous machine 1 with permanent magnets 4 and sinusoidal electromotive force. In this example of a vectorial control system, the synchronous machine 1 includes the converter 14 supplied with electric voltage.

The vectorial control system 13 controls the converter 14 by means of pulse width modulation PWM to generate an average power supply voltage on each of the phases $P_1$, $P_2$, $P_3$ of synchronous machine 1 and thereby, determined current in each of the said phases $P_1$, $P_2$, $P_3$. The converter 14 therefore transforms the voltage supplied by a DC voltage source U into a three phase voltage supplying the synchronous machine 1. The latter operates, for instance, by traction and alternately as a three phase voltage generator when a vehicle is in the braking phase.

The vectorial control system 13 comprises a converter control unit 14, current sensors 15, a voltage sensor 16 and the angular position sensor 1a of the synchronous machine 1.

The vectorial control system 13 receives, for instance, the torque setpoint C. From the information derived from the current sensors 15, the angular position sensor 1a and from the setpoint C, the convert to control unit 14 calculates the voltage vector to be applied to the said converter 14 so that the synchronous machine 1 reaches the torque setpoint C.

The vectorial control system 13, in particular the permanent magnet 4 and sinusoidal electromotive force synchronous machine 1, is known as such and will therefore not be described any further here.

The synchronous machine 1 has the outstanding advantage of comprising an angular position sensor 1a capable of directly measuring the magnetic field produced by the permanent magnets 4 and thereby knowing how the magnetic field changes in the course of time. In this way, any deterioration of the performance of permanent magnets 4 can be detected, and thereby, the performance of the synchronous machine 1.

Furthermore, angular position sensor 1a of synchronous machine 1 is capable of detecting an abrupt increase in the induced magnetic field, resulting from short-circuiting between phases.

Permanent magnet 4 and sinusoidal electric force synchronous machine 1 comprises advantageously a wheel motor.

The synchronous machine conforming to the invention can also be used as a winch motor or an elevator motor.

The synchronous machine 1 therefore allows the implementation of a process to measure the ageing of permanent magnets 4 conforming to the invention by means of a succession of steps explained in the following.

In a first step j1), determining, at a stop for during an on load or off load rotation phase of the synchronous machine 1, the maximum magnetic induction value $VM_{max}$ through magnetic induction measurement sensors 6 connected to the electronic unit, Note that during an off load rotation phase, the electric current generated in the synchronous machine 1 is nil.

In a second step j2), comparing the measured maximum magnetic induction value $VM_{max}$ with a reference value.

In a third step j3) if the maximum magnetic induction value $VM_{max}$ is less than the reference value, having a determined deviation from the said reference value, alert information S is determined via the electronic unit, and otherwise, the process is resumed from step j1).

According to one implementation example complying with the invention, the method consists in using a maximum magnetic induction value $VM_{max}$ measured during the initial use of the synchronous machine 1 as a reference value.

According to one implementation example complying with the invention, the method consists in using a theoretical or predefined value $VT_{max}$ as a reference value.

According to one implementation example complying with the invention, the method consists in using a value $VM_{max}$ decreasing with time as a reference value. A reduction like this results in a curve which is, for instance, linear. In this way, the initial reference value of this decreasing curve can be either the measured value $VM_{max(i)}$, or the theoretical or predefined value $VT_{max}$.

According to one implementation example complying with the invention, the method consists in generating the alert information when the deviation is equal to or greater than 20%. A smaller deviation can also be chosen, as an example, without moving out of the framework of the invention.

Thanks to computer 12, the absolute angular position of rotor 3 and normal or premature raging of permanent magnets 4 or of some permanent magnets for can be determined jointly, in conformity with the procedure described above. Computer 12 can thus identify which of the permanent magnets 4 need to be replaced if the current performance is to be preserved, even when the measurements are made during a rotation phase of synchronous machine 1.

As mentioned previously, the process conforming to the invention advantageously allows the magnetic field to be measured whether the synchronous machine 1 is operating off load or on load, for instance by traction or braking, in the case of a wheel motor. Under load, this measurement of the magnetic field depends on the intensity of the electric current supplied to the motor meaning that it is essential to map the machine to obtain a reference curve of the magnetic field expected according to the intensity of the electric current supplied to the synchronous machine.

This mapping of the synchronous machine is performed preferentially at the manufacturer's, on new machines. It consists in measuring the magnetic field by means of Hall effect or magnetoresistance sensors during the operation of synchronous machine 1. These measurements are then transmitted to an electronic unit, also receiving information about the motor current coming from the current sensors. Subsequently, these values can be used for producing graphs or other sets of reference data for the operation of a new synchronous machine 1.

For instance, this reference data is stored in an electronic unit of angular position sensor 1a.

Accordingly, for a given intensity of the electric current supplied to synchronous machine 1, there is a corresponding magnetic field reference value. When the magnetic field measurements for a given motor current do not correspond to the expected reference value of the magnetic field, alert information S is then sent by means of the electronic unit.

The method of the invention can be used on a synchronous machine 1 on load, by means of an angular position sensor 1a according to the embedded invention because it is integrated into the synchronous machine 1. Naturally, it can be used on a measurement bench during maintenance operations on the synchronous machine 1, for instance as a stop or during free rotation, without traction or breaking.

The method conforming to the invention also allows the magnetic field to be measured for permanent magnets 4 placed facing the magnetic induction measurement sensors 6 when the synchronous machine 1 is at a stop.

It is obvious that this description is not confined to the examples explicitly described but also extends to other embodiments and/or implementation methods. Accordingly, described technical characteristic or a described step, maybe replaced by an equivalent technical characteristic or an equivalent step, without moving out of the framework of the invention.

The invention claimed is:

1. A method of measuring the ageing of permanent magnets in a multiphase synchronous machine comprising a stator and a rotor, the synchronous machine being equipped with at least one rotor angular position sensor, the stator comprising a winding designed to be supplied with current, the rotor comprising the permanent magnets moveable around the stator, the angular position sensor comprising at least two fixed magnetic induction measuring sensors and at least one electronic unit, the magnetic induction measuring sensors integral with the stator, extending at the axial end of the rotor opposite to and immediately next to the axial edges of the permanent magnets, the method comprising:
   j1) determining during an on-load rotation phase of the synchronous machine, a maximum magnetic induction value $VM_{max}$ via the magnetic induction measurement sensors connected to the electronic unit;
   j2) comparing the measured maximum magnetic induction value $VM_{max}$ with a reference value; and
   j3) if the maximum magnetic induction value $VM_{max}$ is less than the reference value, and having a determined deviation with respect to the reference value, generating alert information by the electronic unit, or otherwise reverting to step j1).

2. The method according to claim 1, comprising using a maximum magnetic induction value $VM_{max}$ initial measured during an initial use of the synchronous machine as the reference value.

3. The method according to claim 1, comprising using a theoretical or predefined value $VT_{max}$ as the reference value.

4. The method according to claim 1, wherein the reference value is a magnetic induction reference value that decreases as a function of time.

5. The method according to claim 4, wherein the reference value is a magnetic induction reference value that decreases linearly as a function of time.

6. The method according to claim 1, comprising generating the alert information when the deviation is equal to or greater than 20%.

7. The method according to claim 1, wherein the method is implemented on a vehicle wheel motor.

8. The method according to claim 7, wherein the method is performed during wheel motor maintenance operations while the multiphase synchronous machine is positioned on a measurement bench.

9. The method according to claim 1, wherein when the synchronous machine is on-load, the measured value $VM_{max}$ of the maximum magnetic induction is compared to a predetermined reference value as the reference value, the predetermined reference value being stored in a set of data comprising maximum magnetic induction values for given electric current intensities supplied to the synchronous machine.

10. The method according to claim 9, wherein the set of data comprising the maximum magnetic induction values for the given electric current intensities supplied to the synchronous machine is stored in the electronic unit.

* * * * *